United States Patent
Duan et al.

(10) Patent No.: US 9,319,032 B2
(45) Date of Patent: Apr. 19, 2016

(54) RAMP SIGNAL GENERATING CIRCUIT AND SIGNAL GENERATOR, ARRAY SUBSTRATE AND DISPLAY APPARATUS

(71) Applicant: BOE TECHNOLOGY GROUP CO., LTD., Beijing (CN)

(72) Inventors: Liye Duan, Beijing (CN); Lirong Wang, Beijing (CN); Zhongyuan Wu, Beijing (CN)

(73) Assignee: BOE TECHNOLOGY GROUP CO., LTD, Beijing (CN)

(*) Notice: Subject to any disclaimer, the term of this patent is extended or adjusted under 35 U.S.C. 154(b) by 0 days.

(21) Appl. No.: 14/416,821

(22) PCT Filed: Apr. 28, 2014

(86) PCT No.: PCT/CN2014/076400
§ 371 (c)(1),
(2) Date: Jan. 23, 2015

(87) PCT Pub. No.: WO2015/089972
PCT Pub. Date: Jun. 25, 2015

(65) Prior Publication Data
US 2015/0207492 A1    Jul. 23, 2015

(30) Foreign Application Priority Data
Dec. 19, 2013  (CN) .......................... 2013 1 0703269

(51) Int. Cl.
*H03K 4/08* (2006.01)
*H03K 4/48* (2006.01)
*H03K 4/90* (2006.01)
*H03K 5/01* (2006.01)
(Continued)

(52) U.S. Cl.
CPC .. *H03K 4/48* (2013.01); *H03K 4/90* (2013.01); *H03K 5/01* (2013.01); *G09G 2310/066* (2013.01)

(58) Field of Classification Search
CPC ............. H03K 4/08; H03K 4/48; H03K 4/90; G09G 2310/066
USPC .......................... 327/131, 133, 134, 135, 140
See application file for complete search history.

(56) References Cited

U.S. PATENT DOCUMENTS 5,565,915 A * 10/1996 Kindo .................. H04N 5/2351
348/229.1
5,604,501 A *  2/1997 McPartland .......... H03M 1/765
341/144
(Continued)

FOREIGN PATENT DOCUMENTS

CN          1604472 A     4/2005
CN        103714774 A     4/2014

OTHER PUBLICATIONS

International Search Report and Written Opinion of the International Searching Authority with Notice of Transmittal of the International Search Report and Written Opinion of PCT/CN2014/076400 in Chinese, mailed Sep. 28, 2014.

*Primary Examiner* — William Hernandez
(74) *Attorney, Agent, or Firm* — Collard & Roe, P.C.

(57) ABSTRACT

A ramp signal generating circuit and ramp signal generator, an array substrate and a display apparatus. The ramp signal generating circuit comprises a first shift register (11), a second shift register possessing a bidirectional scanning function (12), a voltage decreasing unit (13) and a sampling unit (14); the voltage decreasing unit (13) is connected to a power supply input terminal and a ground terminal and is configured to continuously decrease a voltage inputted from the power supply input terminal stage by stage; the first shift register (11) is connected to the voltage decreasing unit (13) and is configured to control the voltage decreasing unit (13) to output voltages which are decreased continuously stage by stage; the sampling unit (14) has an output terminal and is connected to the voltage decreasing unit (13); the second shift register (12) is connected to the sampling unit (14) and is configured to control, through bidirectional scanning, the sampling unit (13) to sample and output the voltages which are decreased continuously stage by stage by the voltage decreasing unit (13). Such ramp signal generating circuit is capable of reducing area of the ramp signal generating circuit and improving linearity of ramp signal.

20 Claims, 7 Drawing Sheets

(56) References Cited

U.S. PATENT DOCUMENTS 6,842,135 B2 * 1/2005 Laflaquiere ............ H03K 4/026
                                                    341/144
2004/0160349 A1   8/2004  Laflaquiere
2005/0067968 A1   3/2005  Yamashita
2015/0076325 A1 * 3/2015  Higuchi ................ H04N 5/357
                                                    250/208.1

* cited by examiner

RAMP SIGNAL GENERATING CIRCUIT AND SIGNAL GENERATOR, ARRAY SUBSTRATE AND DISPLAY APPARATUS

CROSS REFERENCE TO RELATED APPLICATIONS

This application is the National Stage of PCT/CN2014/076400 filed on Apr. 28, 2014, which claims priority under 35 U.S.C. §119 of Chinese Application No. 201310703269.1 filed on Dec. 19, 2013, the disclosure of which is incorporated by reference.

TECHNICAL FIELD OF THE DISCLOSURE

The present disclosure relates to a ramp signal generating circuit and signal generator, an array substrate and a display apparatus.

BACKGROUND

With development of electronic technology, not only rigorous demands are proposed on the appearance and the quality of electronic products, but also higher attention has been paid to price and practicability of the electronic products.

In order to meet public requirements, SOG (System on Glass) technology has been widely applied in the existing electronic products. SOG refers to integrating driving circuit and system circuit on an array substrate, and appearance of such technology has provided great convenience to manufacture and design of electronic product. The manufacture cost of the electronic products is greatly reduced since developers only need to perform simulation on the system circuit based on TFT and then can implement the circuit through a certain process. In addition, the products can also be greatly miniaturized by adopting highly integrated circuit design.

Especially for a display panel, SOG can integrate a driving system comprising a gate driver, a data driver, a multiplexer (Mux), a DC-DC converter (DC-DC), an digital to analog converter (DAC), a timing sequence controller (TCON) and so on, such that cost can be reduced greatly, screen bezel can be minimized, and problems of voltage drop on resistor, noise, reliability and so on caused by mutual connection among different driving chips can be solved. In order to implement more system functions, the development of the SOG technology is in direction of much higher integration and much more miniaturization, and the development of the display has the tendency of low cost, energy saving, low weight and thin thickness. The SOG technology has became the inevitable trend of the development of the system circuit.

In the existing display panels, various models requiring to be driven by a ramp signal and comprising DA converter, AD converter and so on are comprised in array substrates. However, a ramp signal generator cannot be effectively integrated by adopting the current SOG technology, and a ramp signal generator additionally arranged will cause area of the driving circuits to be increased greatly, which has a restriction on the further miniaturization of the display apparatus. On the other hand, it is difficult for the existing ramp signal generator to generate a ramp signal output having good linearity, which may dramatically limit the quality of the display apparatus.

SUMMARY

In embodiments of the present disclosure, there are provided a ramp signal generating circuit and signal generator, an array substrate and a display apparatus capable of reducing area of the ramp signal generating circuit and improving linearity of ramp signal.

According to an aspect of the embodiments of the present disclosure, there is provided a ramp signal generating circuit comprising a first shift register, a second shift register possessing a bidirectional scanning function, a voltage decreasing unit and a sampling unit; the voltage decreasing unit is connected to a power supply input terminal and a ground terminal and is configured to continuously decrease a voltage inputted from the power supply input terminal stage by stage; the first shift register is connected to the voltage decreasing unit and is configured to control the voltage decreasing unit to output voltages which are decreased continuously stage by stage; the sampling unit has an output terminal and is connected to the voltage decreasing unit; the second shift register is connected to the sampling unit and is configured to control, through bidirectional scanning, the sampling unit to sample and output the voltages which are decreased continuously stage by stage by the voltage decreasing unit.

According to another aspect of the embodiments of the present disclosure, there is further provided a ramp signal generator comprising the above described ramp signal generating circuit.

In addition, according to another aspect of the embodiments of the present disclosure, there is provided an array substrate comprising a first shift register and a second shift register, wherein the second shift register has a bidirectional scanning function, the first shift register is configured to generate a gate line scan signal and the second shift register is configured to generate the data line scan signal. The array substrate further comprise: a voltage decreasing unit and a sampling unit, wherein the voltage decreasing unit is connected to a power supply input terminal and a ground terminal and is configured to continuously decrease a voltage inputted from the power supply input terminal stage by stage. The first shift register is connected to the voltage decreasing unit and is configured to control the voltage decreasing unit to output voltages which are decreased continuously stage by stage. The sampling unit has an output terminal and is connected to the voltage decreasing unit. The second shift register is connected to the sampling unit, and is configured to control, through bidirectional scanning, the sampling unit to sample and output the voltages which are decreased continuously stage by stage by the voltage decreasing unit.

According to another aspect of the embodiments of the present disclosure, there is provided a display apparatus comprising the above described array substrate.

The ramp signal generating circuit, the ramp signal generator, the array substrate and the display apparatus adopt a designed structure comprising two shift register units, a voltage decreasing unit and a sampling unit to form a ramp signal generating circuit and achieve the ramp signal generating function, adopt different designed signal timing sequences to allow that the two shift register units drive the voltage decreasing unit and the sampling unit respectively, such that the first shift register unit controls the voltage decreasing unit to output voltages which are decreased continuously stage by stage and generated by continuously decreasing a voltage inputted from the power supply input terminal stage by stage, and the second shift register unit controls the sampling unit to sample and output the voltages which are decreased continuously stage by stage and then outputted by the voltage decreasing unit. Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

BRIEF DESCRIPTION OF THE DRAWINGS

In order to more clearly describe the technical solutions of the embodiments of the present disclosure or the prior art, drawings necessary for describing the embodiments of the present disclosure or the prior art are simply introduced as follows. It should be obvious for those skilled in the art that the drawings described below are only some embodiments of the present disclosure. Other drawings can be obtained by those skilled in the art based on these drawings without paying creative labor.

DETAILED DESCRIPTION

Technical solutions in embodiments of the present disclosure will be described below clearly and completely in combination with the accompanying drawings in the embodiments of the present disclosure. Obviously, the embodiments as described are only some of the embodiments of the present disclosure, and are not all of the embodiments of the present disclosure. All other embodiments obtained by those skilled in the art based on the embodiments in the present disclosure without paying any inventive labor should fall into the protection scope of the present disclosure.

Figure 1:
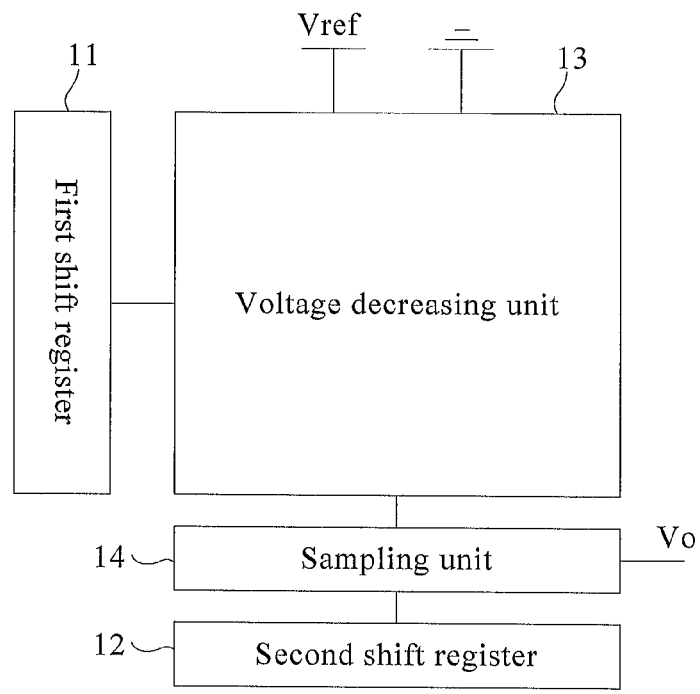
FIG. 1 is a schematic structure diagram of a ramp signal generating circuit provided in the embodiment of the present disclosure.

As shown in FIG. 1, a pixel circuit provided in the embodiments of the present disclosure comprises: a first shift register 11, a second shift register 12 possessing a bidirectional scanning function, a voltage decreasing unit 13 and a sampling unit 14.

The voltage decreasing unit 13 is connected to a power supply input terminal Vref and a ground terminal, and is configured to continuously decrease a voltage inputted from the power supply input terminal Vref stage by stage.

The first shift register 11 is connected to the voltage decreasing unit 13, and is configured to control the voltage decreasing unit 13 to output voltages which are decreased continuously stage by stage.

The sampling unit 14 has an output terminal Vo, and is connected to the voltage decreasing unit 13.

The second shift register 12 is connected to the sampling unit 14, and is configured to control, through bidirectional scanning, the sampling unit 14 to sample and output the voltages which are decreased continuously stage by stage by the voltage decreasing unit 13.

A ramp signal generating circuit provided in the embodiments of the present disclosure adopts a designed structure comprising two shift register units, a voltage decreasing unit and a sampling unit, adopts different designed signal timing sequences to allow that the two shift register units drive the voltage decreasing unit and the sampling unit respectively, such that the first shift register unit controls the voltage decreasing unit to output voltages which are decreased continuously stage by stage and generated by continuously decreasing a voltage inputted from the power supply input terminal stage by stage, and the second shift register unit controls the sampling unit to sample and output the voltages which are decreased continuously stage by stage and then outputted by the voltage decreasing unit. Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

The voltage decreasing unit 13 can adopt various known circuit configuration or electric device capable of decreasing an input voltage stage by stage, and the embodiments of the present disclosure will not limit the structure of the voltage decreasing unit 13.

Figure 2:
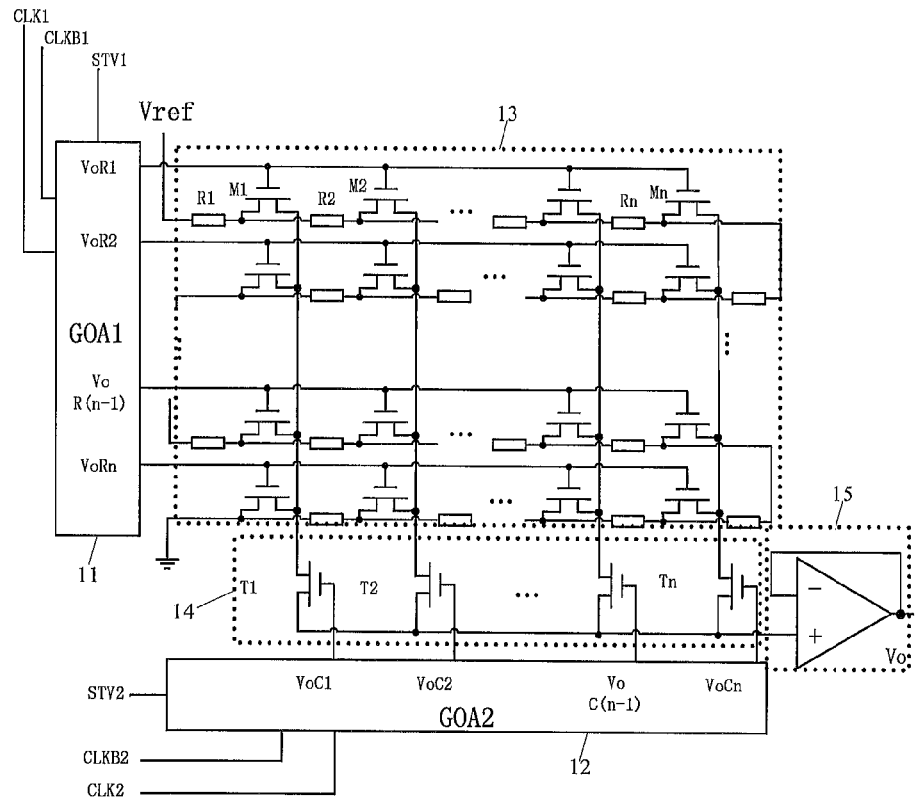
FIG. 2 is a schematic structure diagram of circuit connection of a ramp signal generating circuit provided in the embodiment of the present disclosure.

Particularly, as shown in FIG. 2, the voltage decreasing unit 13 comprises: a plurality of first transistors arranged in a matrix and a plurality of voltage decreasing resistors. As shown in FIG. 2, the first transistors in a first row are represented as M1, M2, ..., Mn, respectively, and the first transistors are represented uniformly as M to simplify the description hereinafter; the voltage decreasing resistors in a first row are represented as R1, R2, ..., Rn, respectively, and the voltage decreasing resistors are represented uniformly as R to simplify the description hereinafter.

Gates of the first transistors M located in a same row are connected to an output terminal of the first shift register 11.

First electrodes of the first transistors M located in a same column are connected to an input terminal of the sampling unit 14.

Second electrodes of the first transistors M located in a same row are connected in series. Particularly, as shown in FIG. 2, the second electrodes of the first transistors M located in a same row are connected in series through voltage decreasing resistors. Particularly, between the second electrodes of every two adjacent first transistors M, there is a voltage decreasing resistor R connected.

In the voltage decreasing unit 13, along the flowing direction of current, the second electrode of the first transistor M located at an $i^{th}$ row and a last column is connected to the second electrode of the first transistor M located at an $(i+1)^{th}$ row and the last column through a voltage decreasing resistor R, the second electrode of the first transistor M located at the $(i+1)^{th}$ row and a first column is connected to the second electrode of the first transistor M located at an $(i+2)^{th}$ row and the first column through a voltage decreasing resistor R, the second electrode of the first transistor M located at an $(i+2)^{th}$ row and the last column is connected to the second electrode of the first transistor M located at an (i+3)$^{th}$ row and the last column through a voltage decreasing resistor R. Depending on different configurations of actual circuits, i can be an odd number or an even number. As shown in FIG. 2, in case that the power supply input terminal Vref is connected at the upstream of the first transistor M located at a first row and the first column (that is, M1 in FIG. 2), i can be an odd number. Along the flowing direction of current, the plurality of voltage decreasing resistors are connected in series, such that there is no branch in which any voltage decreasing resistors are connected in parallel.

As an example, the power supply input terminal is connected to the second electrode of the first transistor located at the first row and the first column in the voltage decreasing unit, the second electrode of the first transistor located at the last row and the last column is grounded in case that the last row of the voltage decreasing unit is an odd row, whereas the second electrode of the first transistor located at the last row and the first column is grounded in case that the last row of the voltage decreasing unit is an even row (as shown in FIG. 2).

Furthermore, in the ramp signal generating circuit as shown in FIG. 2, the input terminals of the first shift register 11 are connected to a first clock signal CLK1, a second clock signal CLKB1 and a first frame start signal STV1, and is configured to turn on the first transistors M row by row.

The input terminals of the second shift register 12 are connected to a third clock signal CLK2, a fourth clock signal CLKB2 and a second frame start signal STV2, and is configured to control the sampling unit 14 to sample in a first direction column by column the voltage at the first electrode of each first transistor M among the first transistors M located in a same row during an ON period of the first transistors M located in the row; and control the sampling unit 14 to sample in a second direction column by column the voltage at the first electrode of each first transistor M among the first transistors M located in a next row during an ON period of the first transistors M located in the next row, wherein the first direction is opposite to the second direction.

In the embodiments of the present disclosure, the shift register unit may particularly be a GOA (Gate Driver on Array) circuit which is constituted by cascaded shift registers. The GOA circuit receives the initially inputted frame start signal STV, and TFTs (Thin Film Transistor) inside the GOA circuit are controlled to be turned on or off according to two clock signals (CLK, CLKB), such that the inputted signal is delivered stage by stage. As an example, the CLKB signal controls signal output of each stage.

Furthermore, as shown in FIG. 2, the sampling unit 14 particularly comprises: a plurality of second transistors. As shown in FIG. 2, the plurality of second transistors are represented as T1, T2, . . . , Tn in a direction from left to right, and the second transistors are uniformly represented as T to simplify the description hereinafter.

Gates of the second transistors T are connected to different output terminals of the second shift register 12, and first electrodes of the second transistors T are connected to an output terminal Vo of the sampling unit 14.

A second electrode of each of the second transistors T is connected to the first electrodes of the first transistors M located in a same column.

It should be noted that both the first transistors M and the second transistors T can be N type transistors in the embodiments of the present disclosure. In case that the first transistors M and the second transistors T are N type transistors, the first electrodes of the transistors may be sources and the second electrodes of the transistors may be drains.

The transistors adopted in the embodiments of the present disclosure can be Thin Film Transistors, Field Effect Transistors or other devices possessing same characteristics. Since the source and the drain of the transistor adopted herein are symmetric, there is no distinction between the source and the drain. In the embodiments of the present disclosure, in order to distinguish the two electrodes other than the gate of a transistor, one of the two electrodes is referred to as the source and the other is referred to as the drain. In addition, depending on the characteristics of a transistor, the transistor can be divided into N type or P type. The following embodiments are described by taking N type transistors as an example, and other embodiments implemented by P type transistors can be easily conceived by those skilled in the art without paying creative labor, and thus should be enclosed in the protection scope defined by the embodiments of the present disclosure.

As can be seen from the ramp signal generating circuit as shown in FIG. 2, the voltage decreasing unit 13 can be constituted by n row-circuits, each of the n row-circuits comprises a series connection of n resistors and n TFT transistors M. Gates of the TFT transistors M are connected to the output signal of the GOA1 circuit. A drain of a TFT transistor M is connected between every two adjacent resistors, that is, drains of two adjacent TFT transistors M are connected through a resistor. Sources of the TFT transistors M located in a same column are connected together to the drains of the TFT transistor T located in the same column. The gates of the TFT transistors T are connected to the output signal of the GOA2 circuit, and the sources of the TFT transistors T are connected to the output terminal Vo.

It should be understood that: although the embodiments of the present disclosure are described by taking the voltage decreasing unit having n rows and n columns as an example, the embodiments of the present disclosure are not so limited, but the row number and the column number can be different.

Figure 3:
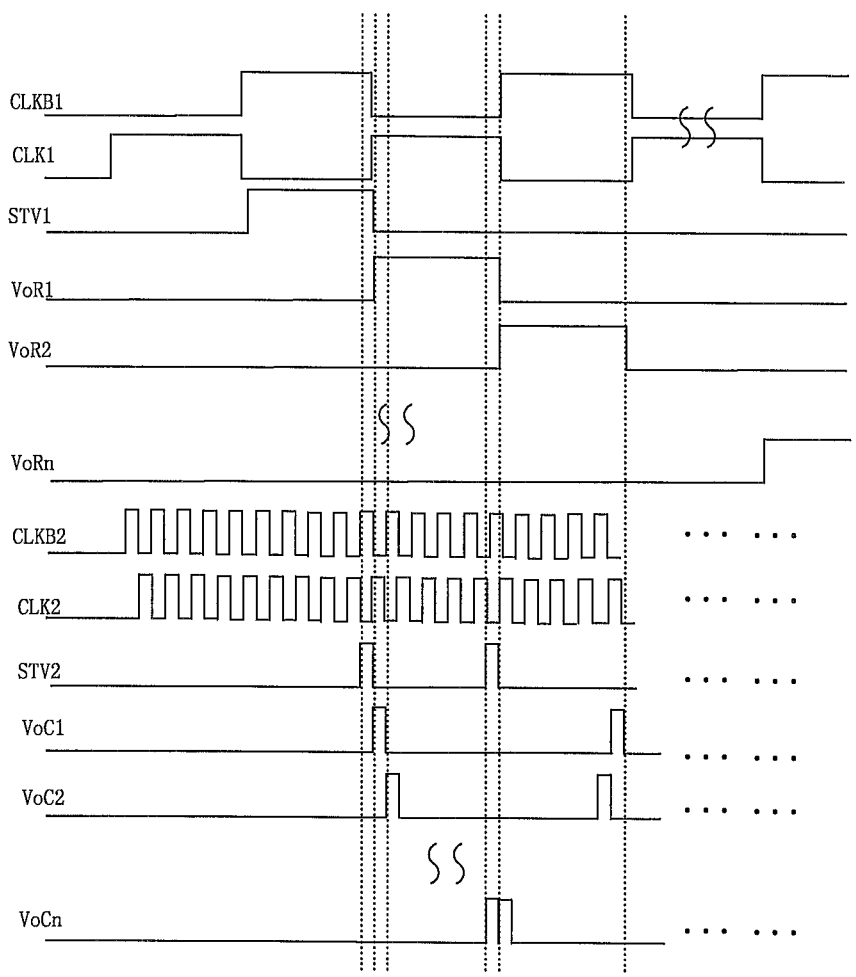
FIG. 3 is a schematic timing sequence diagram of signals when transistors in the ramp signal generating circuit shown in FIG. 2 are N type transistors.

Such structured ramp signal generating circuit can be used to generate a ramp signal. The timing sequence for the driving signals is shown in FIG. 3, and the particular process for generating a ramp signal can comprise two steps of delivering signal and sampling signal.

During the step of delivering signal, a DC input signal is input from one end of the resistors R1 located in the first row through the power supply input terminal Vref. As shown in FIG. 3, the GOA1 circuit is controlled by the clock signals CLK1 and CLKB1, wherein the CLK1 and the CLKB1 have opposite phases. A first output terminal of the GOA1 circuit firstly outputs a signal VoR1 to turn on the TFT transistors M1~Mn located in the first row in the voltage decreasing circuit 13. The clock cycle of the GOA1 circuit is n times of that of the GOA2 circuit, such that the GOA2 circuit controlled by CLK2 and CLKB2 can turn on the TFT transistors T1~Tn (from left to right in FIG. 2) in the sampling unit 14 sequentially when the TFT transistors M located in the first row are turned on by the GOA1 circuit, wherein CLK2 and CLKB2 have opposite phases. Since the respective resistors are same and the respective TFT transistors are same, the voltage signal will be decreased sequentially and evenly. When scanning of the TFT transistors M located in the first row is finished, a second output terminal of the GOA1 circuit outputs a signal VoR2 to turn on the TFT transistors M located in a second row. The resistor Rn located at the tail end of the first row (right end in FIG. 2) delivers voltage signal to the resistor Rn located at the tail end of the second row (right end in FIG. 2). GOA2 circuit turns on the transistors Tn~T1 sequentially in a reverse direction (right to left in FIG. 2) when the TFT transistors M located in the second row are turned on. In this manner, signal is delivered to the $n^{th}$ row, row by row, until the tail end of the resistor Rn located in the $n^{th}$ row is grounded.

It should be noted that: in the embodiments of the present disclosure, the clock cycle of the GOA circuit particularly refers to the time length during which a high level or a low level is outputted continuously. The expression of "the clock cycle of the GOA1 circuit is n times of that of the GOA2 circuit" can be understood that the time length during which the GOA1 circuit outputs a high level continuously is n times of the time length during which the GOA2 circuit outputs a high level continuously. That is, during the time length during which the GOA1 circuit continuously outputs a high level to one row (or one column), the GOA2 circuit outputs a high level for the n columns (or n rows) sequentially.

During the step of sampling signal, when the resistors R1~Rn and the TFT transistors M1~Mn located in the first row operate, the TFT transistors T1~Tn are turned on by the GOA2 circuit sequentially (for example, from left to right in FIG. 2). The drain of each of the TFT transistors T is connected to the sources of the TFT transistors M located in a column corresponding to the TFT transistor T, the sources of the TFT transistors T are connected to the output signal Vo, such that Vo samples and shows, in chronological order, ramp voltage signals which are generated by the resistors R and the TFT transistors M located in the first row and decrease linearly. When the resistors R and the TFT transistors M located in the second row operate, the TFT transistors Tn~T1 are turned on by the GOA2 circuit sequentially in a reverse direction, Vo samples and shows ramp voltage signals which are generated by the resistors R and the TFT transistors M located in the second row and decrease linearly. A decreasing ramp signal is successively sampled until the sampled ramp voltage signal generated by the $n^{th}$ row is decreased to 0. In such manner, ramp signals can be sampled recurrently.

Figure 4:
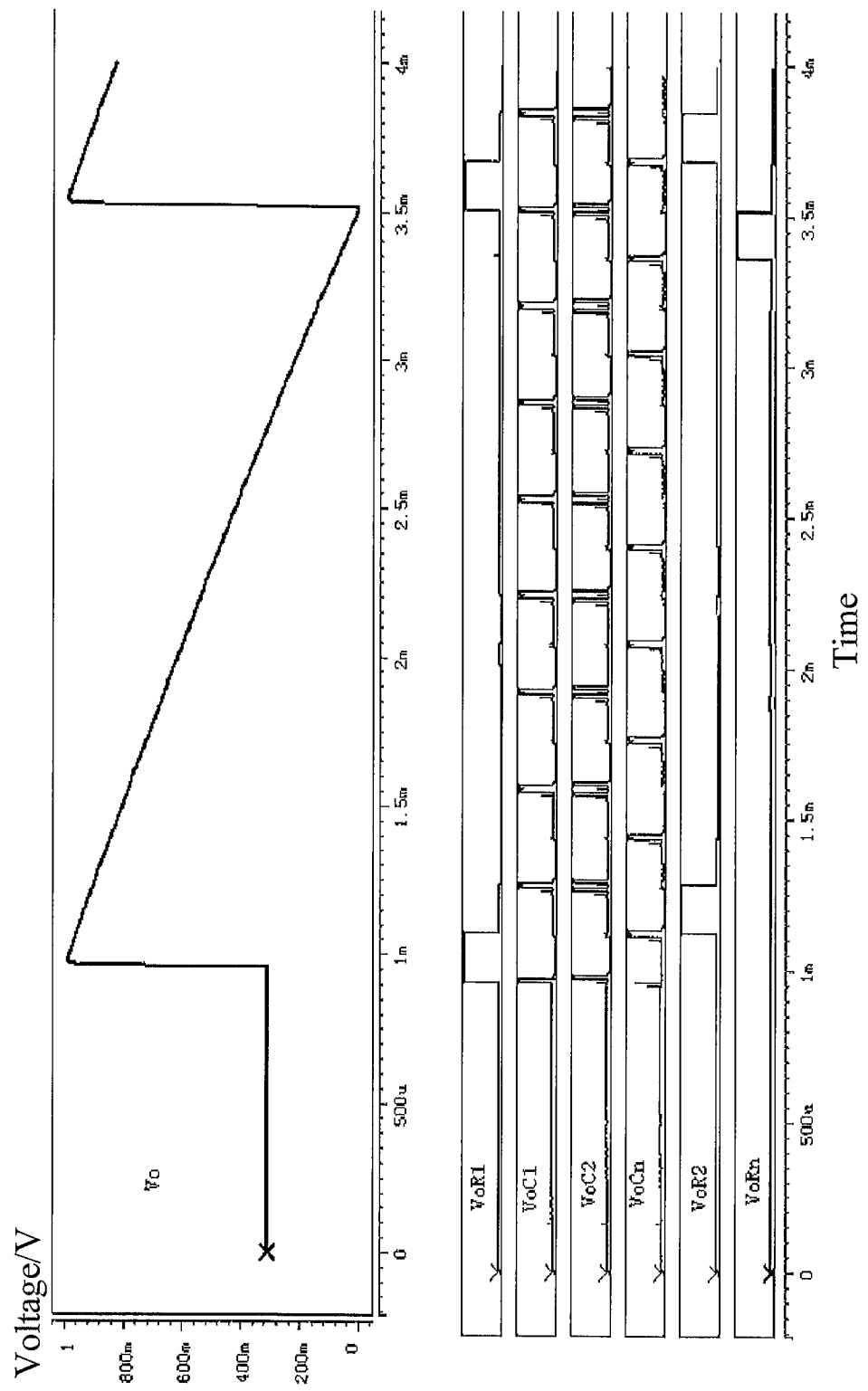
FIG. 4 is a simulated waveform diagram of an output signal of the ramp signal generating circuit shown in FIG. 2.

Simulation of the output signal Vo of such ramp signal generating circuit is shown in FIG. 4. As can be seen from FIG. 4, the GOA1 circuit outputs the high level from the first output terminal to the $n^{th}$ output terminal sequentially during a complete frame scanning period, as shown by VoR1 (the first output terminal), VoR2 (the second output terminal) and VoRn (the $n^{th}$ output terminal) in FIG. 4, such that a complete sample signal is achieved. During the time period of the high level of VoR1, one scanning is achieved by the output signals VoC1~VoCn of the GOA2 circuit; when the high level of VoR2 comes, a reverse scanning is achieved by the output signal VoC1~VoCn; and so on until a frame scanning cycle ends. As shown in the signal simulation diagram, the ramp signal generating circuit provided in the embodiments of the present disclosure can generate a decreasing ramp waveform having good linearity.

It should be explained that: the row number and the column number of the matrix of the transistors M in the embodiments of the present disclosure can be selected according to actual requirements. It should be easily conceived that when the row number and the column number of the transistors M are increased, the linearity of the ramp signal can be further improved by increasing the number of the scan output terminals of the GOA circuit and increasing the frequency of sampling on the voltage signals.

In the above embodiments, the description is given by taking the case that the power supply input terminal Vref is connected to the drain of the first transistor M located at the first row and the first column and the drain of the first transistor M located at the last row and the first column is grounded as an example. However, the embodiments of the present disclosure are not so limited, and it is possible that the drain of the first transistor M located at the last row and the last column is grounded depending on the actual row number of the voltage decreasing unit. In addition, it is possible that the drain of the first transistor M located at the first row and the last column is connected to the power supply input terminal Vref and the first transistor M located at the first row and the first column is connected to the first transistor M located at the second row and the first column via the voltage decreasing resistor.

Alternatively, the power supply input terminal Vref is connected to the drain of the first transistor M located at the last row and the first column and the drain of the first transistor M located at the first row and the first column is connected to the ground terminal. However, the embodiments of the present disclosure are not so limited, it is possible that the drain of the first transistor M located at the first row and the last column is connected to the ground terminal. In addition, it is possible that the drain of the first transistor M located at the last row and the last column is connected to the power supply input terminal Vref and the first transistor M located at the last row and the first column is connected to the first transistor M located at the last second row and the first column via the voltage decreasing resistor.

As another example, the power supply input terminal is connected to the second electrode of the first transistor located at the last row and the last column, the second electrode of the first transistor located at the first row and the first column is connected to the ground terminal in case that the last row of the voltage decreasing unit is an odd row, and the second electrode of the first transistor located at the first row and the last column is connected to the ground terminal in case that the last row of the voltage decreasing unit is an even row.

As another example, the power supply input terminal is connected to the second electrode of the first transistor located at the last row and the first column, the second electrode of the first transistor located at the first row and the last column is connected to the ground terminal in case that the last row of the voltage decreasing unit is an odd row, and the second electrode of the first transistor located at the first row and the first column is connected to the ground terminal in case that the last row of the voltage decreasing unit is an even row.

Figure 5:
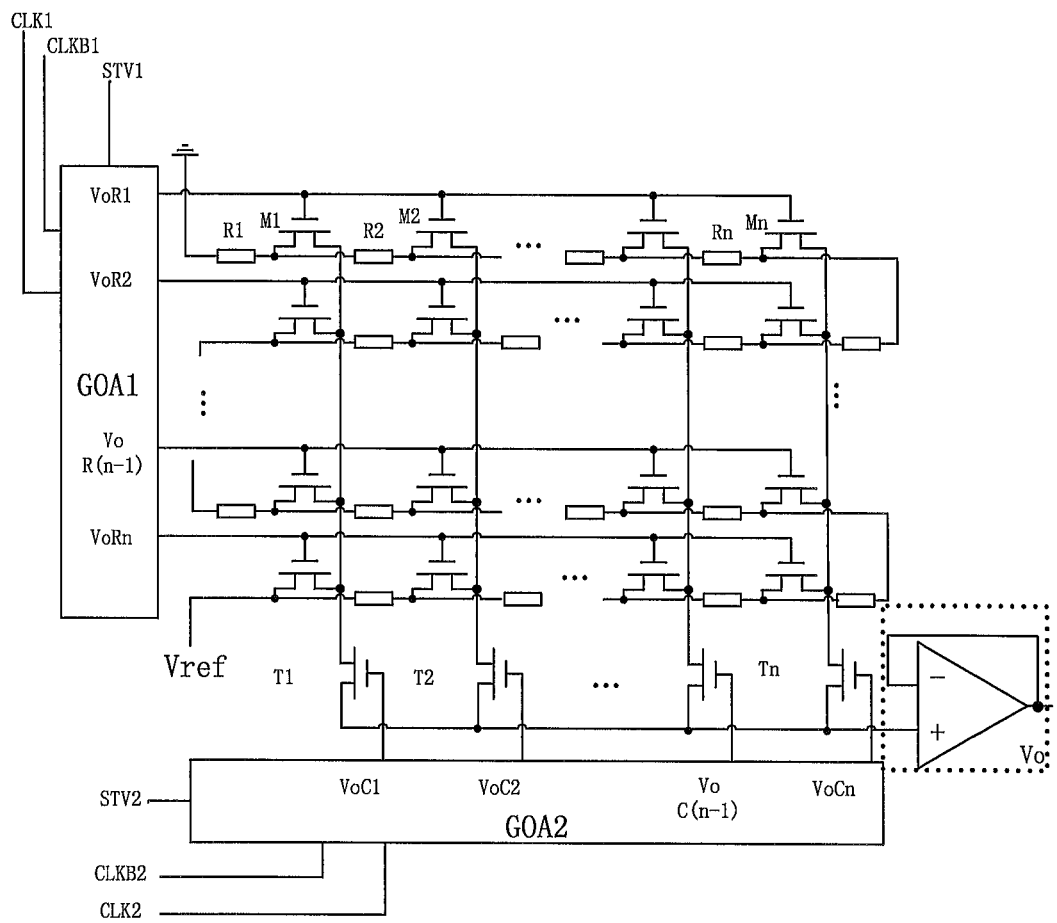
FIG. 5 is a schematic structure diagram of circuit connection of another ramp signal generating circuit provided in the embodiment of the present disclosure.

Particularly, as shown in FIG. 5, the drain of the first transistor M located at the first row and the first column is grounded through a resistor R1, the drain of the first transistor M located at the $n^{th}$ row and the first column is connected to the DC input signal Vref, such structured ramp signal generating circuit can generate an increasing ramp signal waveform. Such structured ramp signal generating circuit also can adopt the signals as shown in FIG. 3 as driving signals, the operation process thereof can also be divided into two sub-processes of delivering signal and sampling signal, and the operation principle thereof is similar to that of the decreasing ramp signal generating circuit as shown in FIG. 2 only with the difference that the voltage is increasing. Alternatively, the drain of the first transistor M located at the first row and the first column can be grounded directly or the drain of the first transistor M located at the $n^{th}$ row and the first column can receive the DC input signal Vref via a resistor.

Figure 6:
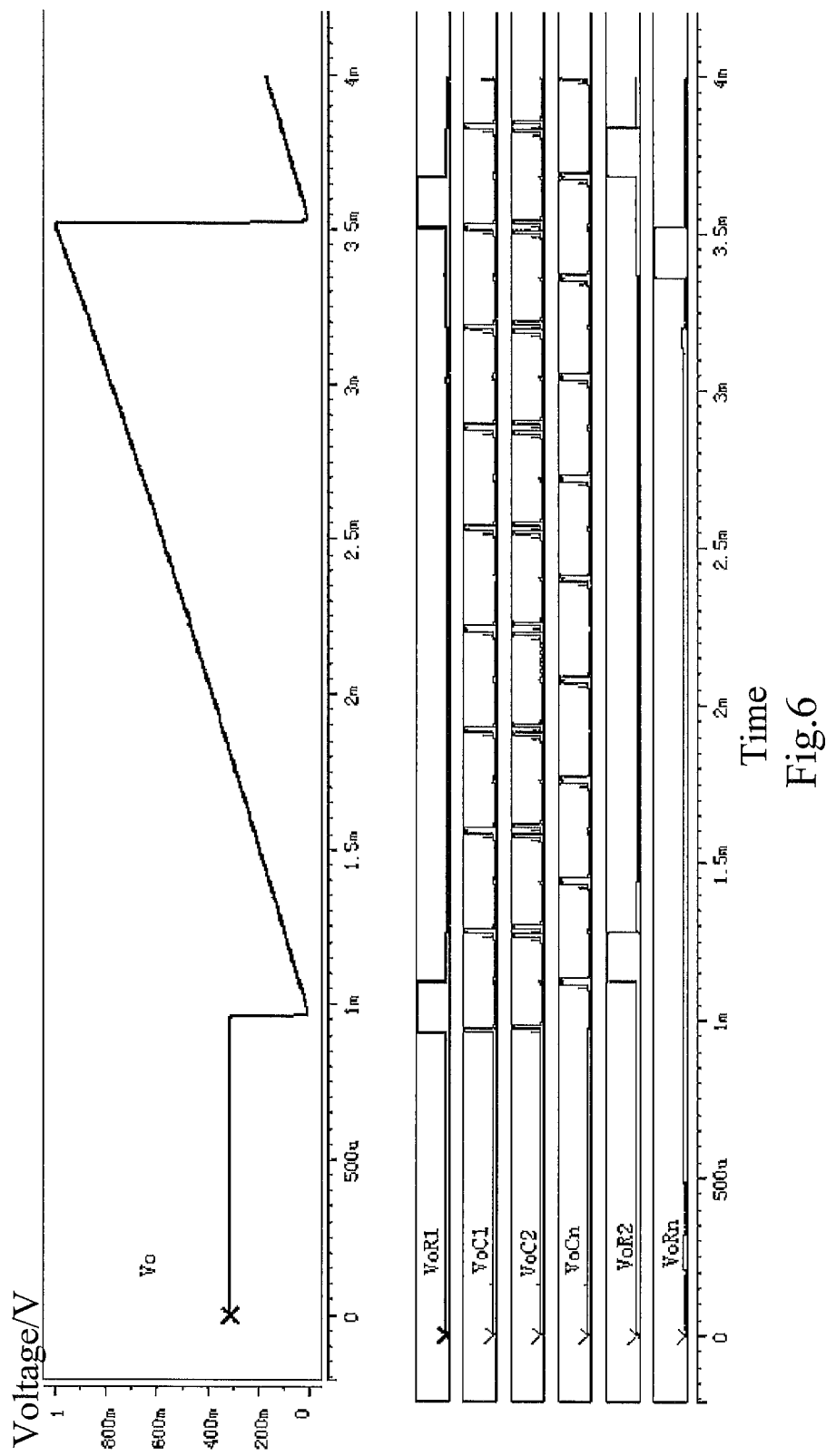
FIG. 6 is a simulated waveform diagram of an output signal of the ramp signal generating circuit shown in FIG. 5.

Signal simulation of the output signal Vo of such ramp signal generating circuit is shown in FIG. 6. From the simulation result, the GOA1 circuit outputs the high level from the first output terminal to the nth output terminal sequentially during a complete frame scanning period, as shown by VoR1 (the first output terminal), VoR2 (the second output terminal) and VoRn (the $n^{th}$ output terminal) in FIG. 6, such that a complete sample signal is achieved. As shown in the signal simulation diagram, the ramp signal generating circuit provided in the embodiments of the present disclosure can generate an increasing ramp waveform having a good linearity.

Figure 7:
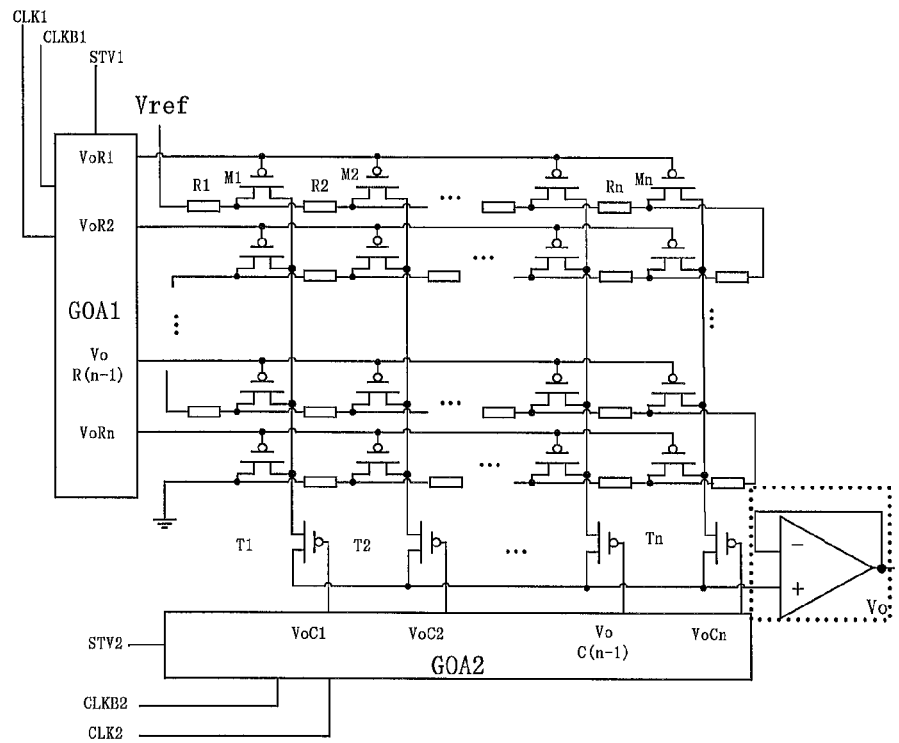
FIG. 7 is a schematic structure diagram of circuit connection of another ramp signal generating circuit provided in the embodiment of the present disclosure.
Figure 8:
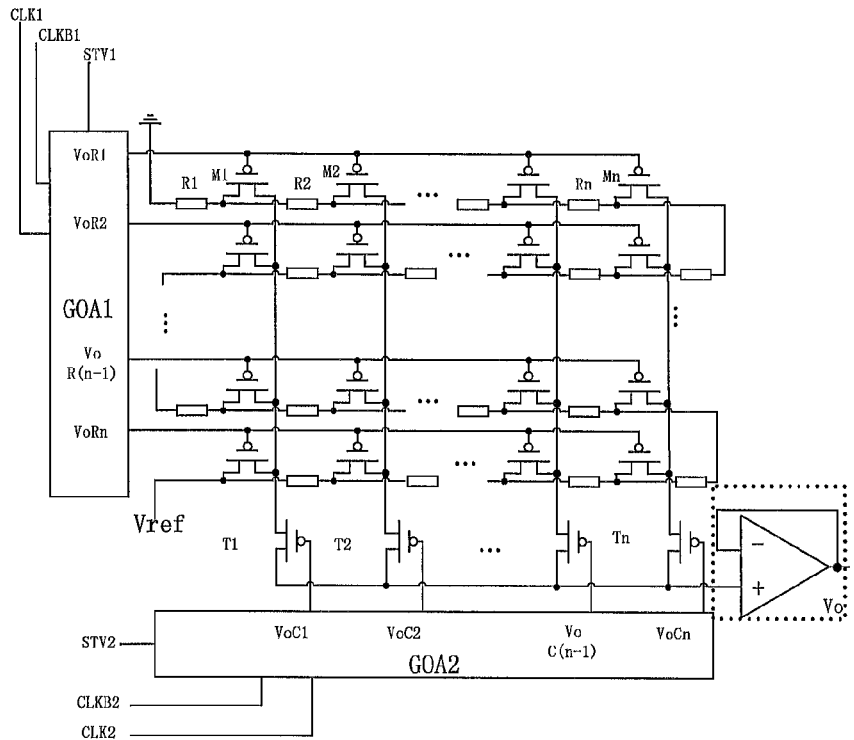
FIG. 8 is a schematic structure diagram of circuit connection of another ramp signal generating circuit provided in the embodiment of the present disclosure.
Figure 9:
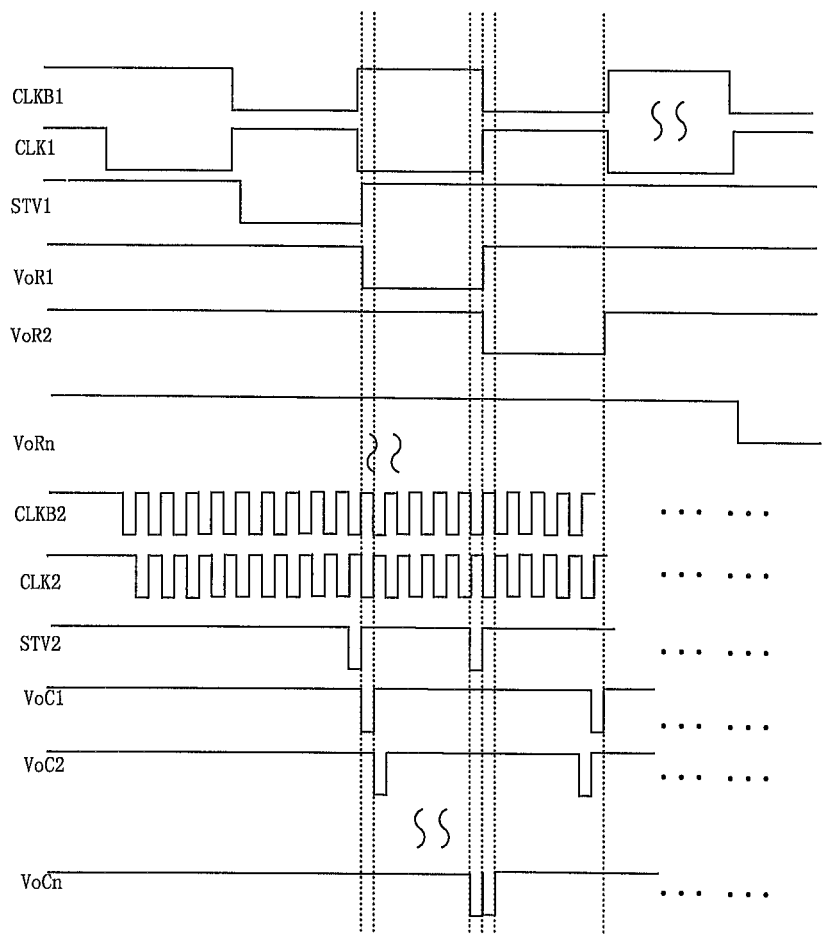
FIG. 9 is a schematic timing sequence diagram of signals when transistors in the ramp signal generating circuit shown in FIG. 7 are P type transistors.

In the above embodiments, the description is given by taking the case that the first transistors M and the second transistors T are N type transistors as an example. Besides, the ramp signal generating circuit provided in the embodiments of the present disclosure can also adopt P type TFTs. When the first transistors M and the second transistors T are all P type transistors, the corresponding decreasing ramp signal generating circuit and the corresponding increasing ramp signal generating circuit are as shown in FIG. 7 and FIG. 8, respectively. FIG. 9 is a circuit timing sequence diagram for driving the ramp signal generating circuit shown in FIG. 7 or FIG. 8, and the description for the corresponding principle is omitted but can be obtained by referring to the above description for the ramp signal generating circuit having the configuration adopting the N type TFTs.

Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

Furthermore, taking account of the limited driving capability of the signal outputted from the output terminal Vo of the sampling unit 14 in the above ramp signal generating circuit, an amplifying unit 15 can be additionally arranged inside or outside of the ramp signal generating circuit, and an input terminal of the amplifying unit 15 can be connected to the output terminal Vo of the sampling unit 14 for amplifying power of the voltage outputted from the sampling unit 14.

For example, in the ramp signal generating circuit as shown in FIG. 2, the amplifying unit 15 can particularly adopt a power amplifier or other circuits possessing the same function, and no limitation is given to the construction of the amplify unit 15 in the embodiments of the present disclosure.

The ramp signal generating circuit provided in the embodiments of the present disclosure further has advantages that the connection manner of the resistors in the matrix is improved, there is no wiring between adjacent rows, the construction of the resistor matrix is simplified so as to save area. In addition, the ramp signal outputted from such structured ramp signal generating circuit has little disturbance noise, and the linearity of the ramp signal is further improved greatly.

In the embodiments of the present disclosure, there is further provided a ramp signal generator comprising the above described ramp signal generating circuit.

Such ramp signal generator can be used as a signal source individually or combined with other devices, and can be widely applied in various devices or circuit structures requiring ramp signal driving. The structure of the ramp signal generating circuit has been described in the above embodiments, and repeated description will be omitted.

The ramp signal generator provided in the embodiments of the present disclosure comprises the ramp signal generating circuit which adopts a designed structure comprising two shift register units, a voltage decreasing unit and a sampling unit, adopts different designed signal timing sequences to allow that the two shift register units drive the voltage decreasing unit and the sampling unit respectively, such that the first shift register unit controls the voltage decreasing unit to output voltages which are decreased continuously stage by stage and generated by continuously decreasing a voltage inputted from the power supply input terminal stage by stage, and the second shift register unit controls the sampling unit to sample and output the voltages which are decreased continuously stage by stage and then outputted by the voltage decreasing unit. Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

The ramp signal generating circuit provided in the embodiments of the present disclosure can be further applied to an array substrate structure in a display panel. The array substrate in the prior art mostly adopts a circuit structure comprising a first shift register and a second shift register.

The first shift register and the second shift register are configured to input gate line scan signal and data line scan signal to the pixel unit in the display area, respectively. Such pixel array structure can reduce peripheral wiring of the display apparatus so as to achieve the narrow bezel design of a display apparatus.

Furthermore, the above described ramp signal generating circuit can be implemented on the array substrate, the second shift register has a bidirectional scanning function, wherein the first shift register and the second shift register which are configured to input the gate line scan signal and the data line scan signal to the pixel unit in the display area respectively can be used as the first shift register and the second shift register in the ramp signal generating circuit respectively. The array substrate can further particularly comprise: a voltage decreasing unit and a sampling unit, the voltage decreasing unit is connected to a power supply input terminal and a ground terminal and is configured to continuously decrease a voltage inputted from the power supply input terminal stage by stage. The first shift register is connected to the voltage decreasing unit and is configured to control the voltage decreasing unit to output voltages which are decreased continuously stage by stage. The sampling unit has an output terminal and is connected to the voltage decreasing unit. The second shift register is connected to the sampling unit, and is configured to control, through bidirectional scanning, the sampling unit to sample and output the voltages which are decreased continuously stage by stage by the voltage decreasing unit.

In such structured array substrate, the ramp signal generating circuit is formed by integrating the voltage decreasing unit and the sampling unit on the array substrate and using the existing two shift register on the array substrate. In such manner, the ramp signal generating function can be achieved without adding many additional devices on the surface of the array substrate, such that area of the driving circuit of the display panel can be effectively controlled and the narrow bezel design of the display apparatus can be ensured. The circuit configuration and its operation manner of the voltage decreasing unit and the sampling unit have been described in detail in the above embodiments of the present disclosure, and repeated description will be omitted herein.

The array substrate provided in the embodiments of the present disclosure comprises the ramp signal generating circuit which adopts a designed structure comprising two shift register units, a voltage decreasing unit and a sampling unit, adopts different designed signal timing sequences to allow that the two shift register units drive the voltage decreasing unit and the sampling unit respectively, such that the first shift register unit controls the voltage decreasing unit to output voltages which are decreased continuously stage by stage and generated by continuously decreasing a voltage inputted from the power supply input terminal stage by stage, and the second shift register unit controls the sampling unit to sample and output the voltages which are decreased continuously stage by stage and then outputted by the voltage decreasing unit. Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

A display apparatus provided in the embodiments of the present disclosure comprises the above described array substrate.

It should be explained that the display apparatus provided in the embodiments of the present disclosure may be any product or component having display function comprising display panel, electronic paper, OLED panel, liquid crystal television, liquid crystal display, digital frame, cell phone, tablet computer and so on.

The structure of the array substrate has been described in detail in the above embodiments of the present disclosure, and repeated description is omitted herein.

Such structured display apparatus comprises the array substrate which adopts a designed structure comprising two shift register units, a voltage decreasing unit and a sampling unit to form a ramp signal generating circuit and achieve the ramp signal generating function, adopts different designed signal timing sequences to allow that the two shift register units drive the voltage decreasing unit and the sampling unit respectively, such that the first shift register unit controls the voltage decreasing unit to output voltages which are decreased continuously stage by stage and generated by continuously decreasing a voltage inputted from the power supply input terminal stage by stage, and the second shift register unit controls the sampling unit to sample and output the voltages which are decreased continuously stage by stage and then outputted by the voltage decreasing unit. Such structured ramp signal generating circuit comprises less component units and has a high integration level in circuit configuration, thus capable of reducing area occupied by the ramp signal generating circuit. In addition, compared to the prior art, such structured ramp signal generating circuit can have a higher sampling frequency and can obtain more voltage stages and a smaller voltage step, thus capable of improving effectively linearity of a ramp signal.

Those ordinary skilled in the art can clearly understand that all or part of procedures implementing the above method embodiments of the present disclosure may be implemented through computer program instructing related hardware. The computer program may be stored in a computer readable storage medium, and performs the steps in the above method embodiments of the present disclosure when being executed. The computer readable storage medium may comprise various media capable of storing program codes for example, a ROM/RAM, a magnetic disk, an optical disk, and so on.

The above descriptions are only for illustrating the embodiments of the present disclosure, and in no way limit the protection scope of the present disclosure. It will be obvious that those skilled in the art may conceive of variations and alternatives in the technical scope disclosure in the embodiments of the present disclosure. Such variations and alternatives are intended to be comprised within the protection scope of the present disclosure. Therefore, the protection scope of the present disclosure should be defined according to the protection scope of the attached claims.

What is claimed is:

1. A ramp signal generating circuit comprising:
   a first shift register, a second shift register possessing a bidirectional scanning function, a voltage decreasing unit and a sampling unit;
   the voltage decreasing unit is connected to a power supply input terminal and a ground terminal and is configured to continuously decrease a voltage inputted from the power supply input terminal stage by stage;
   the first shift register is connected to the voltage decreasing unit and is configured to control the voltage decreasing unit to output voltages which are decreased continuously stage by stage;
   the sampling unit has an output terminal and is connected to the voltage decreasing unit;
   the second shift register is connected to the sampling unit and is configured to control, through bidirectional scanning, the sampling unit to sample and output the voltages which are decreased continuously stage by stage by the voltage decreasing unit.

2. The ramp signal generating circuit of claim 1, wherein the voltage decreasing unit comprises: a plurality of first transistors arranged in a matrix and a plurality of voltage decreasing resistors;
   gates of the first transistors located in a same row are connected to an output terminal of the first shift register;
   first electrodes of the first transistors located in a same column are connected to an input terminal of the sampling unit;
   second electrodes of the first transistors located in a same row are connected in series through voltage decreasing resistors, the second electrode of the first transistor located at an ith row and a last column is connected to the second electrode of the first transistor located at an (i+1)th row and the last column through a voltage decreasing resistor, the second electrode of the first transistor located at the (i+1)th row and a first column is connected to the second electrode of the first transistor located at an (i+2)th row and the first column through a voltage decreasing resistor, wherein i is an odd number or an even number.

3. The ramp signal generating circuit of claim 2, wherein input terminals of the first shift register are connected to a first clock signal, a second clock signal and a first frame start signal, and is configured to turn on the first transistors row by row;
   input terminals of the second shift register are connected to a third clock signal, a fourth clock signal and a second frame start signal, and is configured to control the sampling unit to sample in a first direction column by column the voltage at the first electrode of each first transistor among the first transistors located in a same row during an ON period of the first transistors located in the row; and control the sampling unit to sample in a second direction column by column the voltage at the first electrode of each first transistor among the first transistors located in a next row during an ON period of the first transistors located in the next row, wherein the first direction is opposite to the second direction.

4. The ramp signal generating circuit of claim 2, wherein the sampling unit comprises: a plurality of second transistors;
   gates of the second transistors are connected to different output terminals of the second shift register, and first electrodes of the second transistors are connected to an output terminal of the sampling unit;

a second electrode of each of the second transistors is connected to the first electrodes of the first transistors located in a same column.

5. The ramp signal generating circuit of claim 4, wherein both the first transistors and the second transistors are N type transistors, or both the first transistors and the second transistors are P type transistors;

when the first transistors and the second transistors are N type transistors, the first electrodes of the transistors are sources and the second electrodes of the transistors are drains.

6. The ramp signal generating circuit of claim 2, wherein the power supply input terminal is connected to the second electrode of the first transistor located at the first row and the first column in the voltage decreasing unit, the second electrode of the first transistor located at the last row and the last column is connected to the ground terminal in case that the last row of the voltage decreasing unit is an odd row, whereas the second electrode of the first transistor located at the last row and the first column is connected to the ground terminal in case that the last row of the voltage decreasing unit is an even row; or the power supply input terminal is connected to the second electrode of the first transistor located at the last row and the last column, the second electrode of the first transistor located at the first row and the first column is connected to the ground terminal in case that the last row of the voltage decreasing unit is an odd row, and the second electrode of the first transistor located at the first row and the last column is connected to the ground terminal in case that the last row of the voltage decreasing unit is an even row; or the power supply input terminal is connected to the second electrode of the first transistor located at the last row and the first column, the second electrode of the first transistor located at the first row and the last column is connected to the ground terminal in case that the last row of the voltage decreasing unit is an odd row, and the second electrode of the first transistor located at the first row and the first column is connected to the ground terminal in case that the last row of the voltage decreasing unit is an even row.

7. The ramp signal generating circuit of claim 1, further comprising:

an amplifying unit having an input terminal connected to the output terminal of the sampling unit and being configured for amplifying power of the voltage outputted from the sampling unit.

8. A ramp signal generator, characterized by comprising a ramp signal generating circuit, wherein the ramp signal generating circuit comprises:

a first shift register, a second shift register possessing a bidirectional scanning function, a voltage decreasing unit and a sampling unit;

the voltage decreasing unit is connected to a power supply input terminal and a ground terminal and is configured to continuously decrease a voltage inputted from the power supply input terminal stage by stage;

the first shift register is connected to the voltage decreasing unit and is configured to control the voltage decreasing unit to output voltages which are decreased continuously stage by stage;

the sampling unit has an output terminal and is connected to the voltage decreasing unit;

the second shift register is connected to the sampling unit and is configured to control, through bidirectional scanning, the sampling unit to sample and output the voltages which are decreased continuously stage by stage by the voltage decreasing unit.

9. The ramp signal generator of claim 8, wherein the voltage decreasing unit comprises: a plurality of first transistors arranged in a matrix and a plurality of voltage decreasing resistors;

gates of the first transistors located in a same row are connected to an output terminal of the first shift register;

first electrodes of the first transistors located in a same column are connected to an input terminal of the sampling unit;

second electrodes of the first transistors located in a same row are connected in series through voltage decreasing resistors, the second electrode of the first transistor located at an ith row and a last column is connected to the second electrode of the first transistor located at an (i+1)th row and the last column through a voltage decreasing resistor, the second electrode of the first transistor located at the (i+1)th row and a first column is connected to the second electrode of the first transistor located at an (i+2)th row and the first column through a voltage decreasing resistor, wherein i is an odd number or an even number.

10. The ramp signal generator of claim 9, wherein input terminals of the first shift register are connected to a first clock signal, a second clock signal and a first frame start signal, and is configured to turn on the first transistors row by row;

input terminals of the second shift register are connected to a third clock signal, a fourth clock signal and a second frame start signal, and is configured to control the sampling unit to sample in a first direction column by column the voltage at the first electrode of each first transistor among the first transistors located in a same row during an ON period of the first transistors located in the row; and control the sampling unit to sample in a second direction column by column the voltage at the first electrode of each first transistor among the first transistors located in a next row during an ON period of the first transistors located in the next row, wherein the first direction is opposite to the second direction.

11. The ramp signal generator of claim 9, wherein the sampling unit comprises: a plurality of second transistors;

gates of the second transistors are connected to different output terminals of the second shift register, and first electrodes of the second transistors are connected to an output terminal of the sampling unit;

a second electrode of each of the second transistors is connected to the first electrodes of the first transistors located in a same column.

12. The ramp signal generator of claim 11, wherein both the first transistors and the second transistors are N type transistors, or both the first transistors and the second transistors are P type transistors;

when the first transistors and the second transistors are N type transistors, the first electrodes of the transistors are sources and the second electrodes of the transistors are drains.

13. The ramp signal generator of claim 9, wherein the power supply input terminal is connected to the second electrode of the first transistor located at the first row and the first column in the voltage decreasing unit, the second electrode of the first transistor located at the last row and the last column is connected to the ground terminal in case that the last row of the voltage decreasing unit is an odd row, whereas the second electrode of the first transistor located at the last row and the first column is connected to the ground terminal in case that the last row of the voltage decreasing unit is an even row; or the power supply input terminal is connected to the second electrode of the first transistor located at the last row and the last column, the second electrode of the first transistor located at the first row and the first column is connected to the ground terminal in case that the last row of the voltage decreasing unit is an odd row, and the second electrode of the first transistor located at the first row and the last column is connected to the ground terminal in case that the last row of the voltage decreasing unit is an even row; or the power supply input terminal is connected to the second electrode of the first transistor located at the last row and the first column, the second electrode of the first transistor located at the first row and the last column is connected to the ground terminal in case that the last row of the voltage decreasing unit is an odd row, and the second electrode of the first transistor located at the first row and the first column is connected to the ground terminal in case that the last row of the voltage decreasing unit is an even row.

14. An array substrate comprising a first shift register and a second shift register, wherein the second shift register has a bidirectional scanning function, the first shift register is configured to generate a gate line scan signal and the second shift register is configured to generate a data line scan signal, the array substrate further comprising:
a voltage decreasing unit and a sampling unit,
wherein the voltage decreasing unit is connected to a power supply input terminal and a ground terminal and is configured to continuously decrease a voltage inputted from the power supply input terminal stage by stage;
the first shift register is connected to the voltage decreasing unit and is configured to control the voltage decreasing unit to output voltages which are decreased continuously stage by stage;
the sampling unit has an output terminal and is connected to the voltage decreasing unit;
the second shift register is connected to the sampling unit, and is configured to control, through bidirectional scanning, the sampling unit to sample and output the voltages which are decreased continuously stage by stage by the voltage decreasing unit.

15. The array substrate of claim 14, wherein the voltage decreasing unit comprises: a plurality of first transistors arranged in a matrix and a plurality of voltage decreasing resistors;
gates of the first transistors located in a same row are connected to an output terminal of the first shift register;
first electrodes of the first transistors located in a same column are connected to an input terminal of the sampling unit;
second electrodes of the first transistors located in a same row are connected in series through voltage decreasing resistors, the second electrode of the first transistor located at an $i^{th}$ row and a last column is connected to the second electrode of the first transistor located at an $(i+1)^{th}$ row and the last column through a voltage decreasing resistor, the second electrode of the first transistor located at the $(i+1)^{th}$ row and a first column is connected to the second electrode of the first transistor located at an $(i+2)^{th}$ row and the first column through a voltage decreasing resistor, wherein i is an odd number or an even, number.

16. The array substrate of claim 15, wherein
input terminals of the first shift register are connected to a first clock signal, a second clock signal and a first frame start signal, and is configured to turn on the first transistors row by row;
input terminals of the second shift register is connected to a third clock signal, a fourth clock signal and a second frame start signal, and is configured to control the sampling unit to sample in a first direction column by column the voltage at the first electrode of each first transistor among the first transistors located in a same row during an ON period of the first transistors located in the row; and control the sampling unit to sample in a second direction column by column the voltage at the first electrode of each first transistor among the first transistors located in a next row during an ON period of the first transistors located in the next row, wherein the first direction is opposite to the second direction.

17. The array substrate of claim 15, wherein the sampling unit comprises: a plurality of second transistors;
gates of the second transistors are connected to different output terminals of the second shift register, and first electrodes of the second transistors are connected to an output terminal of the sampling unit;
a second electrode of each of the second transistors is connected to the first electrodes of the first transistors located in a same column.

18. The array substrate of claim 17, wherein
both the first transistors and the second transistors are N type transistors, or both the first transistors and the second transistors are P type transistors;
when the first transistors and the second transistors are N type transistors, the first electrodes of the transistors are sources and the second electrodes of the transistors are drains.

19. The array substrate of claim 15, wherein
the power supply input terminal is connected to the second electrode of the first transistor located at the first row and the first column in the voltage decreasing unit, the second electrode of the first transistor located at the last row and the last column is connected to the ground terminal, in case that the last row of the voltage decreasing unit is an odd row, whereas the second electrode of the first transistor located at the last row and the first column is connected to the ground terminal in case that the last row of the voltage decreasing unit is an even row; or the power supply input terminal is connected to the second electrode of the first transistor located at the last row and the last column, the second electrode of the first transistor located at the first row and the first column is connected to the ground terminal in case that the last row of the voltage decreasing unit is an odd row, and the second electrode of the first transistor located at the first row and the last column, is connected to the ground terminal in case that the last row of the voltage decreasing unit is an even row; or the power supply input terminal is connected to the second electrode of the first transistor located at the last row and the first column, the second electrode of the first transistor located at the first row and the last column is connected to the ground terminal in case that the last row, of the voltage decreasing unit is an odd row, and the second electrode of the first transistor located at the first row and the first column is connected to the ground terminal in case that the last row of the voltage decreasing unit is an even row.

20. The array substrate of claim 14, further comprising:
an amplifying unit having an input terminal connected to the output terminal of the sampling unit and being configured for amplifying power of the voltage outputted from the sampling unit.

\* \* \* \* \*